(12) United States Patent
Funston

(10) Patent No.: US 7,966,345 B1
(45) Date of Patent: Jun. 21, 2011

(54) METHOD, SYSTEM, AND GRAPHICAL USER INTERFACE FOR GENERATING FIRMWARE CODE FOR A PROGRAMMABLE INTEGRATED CIRCUIT

(75) Inventor: David Paul Funston, Edmonds, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 358 days.

(21) Appl. No.: 12/058,591

(22) Filed: Mar. 28, 2008

(51) Int. Cl.
*G06F 7/00* (2006.01)
*G06F 17/30* (2006.01)

(52) U.S. Cl. ........ 707/793; 707/792; 707/803; 715/826; 715/828

(58) Field of Classification Search .......... None
See application file for complete search history.

(56) References Cited

U.S. PATENT DOCUMENTS

| | | | | |
|---|---|---|---|---|
| 4,403,303 | A * | 9/1983 | Howes et al. | 703/27 |
| 5,488,650 | A * | 1/1996 | Greco et al. | 379/88.22 |
| 5,625,783 | A * | 4/1997 | Ezekiel et al. | 719/320 |
| 5,774,671 | A * | 6/1998 | Satoh | 709/231 |
| 5,790,863 | A * | 8/1998 | Simonyi | 717/113 |
| 5,917,492 | A * | 6/1999 | Bereiter et al. | 715/854 |
| 6,301,583 | B1 * | 10/2001 | Zellweger | 715/810 |
| 2001/0002128 | A1 * | 5/2001 | Takayama et al. | 345/352 |
| 2002/0101459 | A1 * | 8/2002 | Herle et al. | 345/866 |
| 2003/0020765 | A1 * | 1/2003 | Kussmaul et al. | 345/853 |
| 2003/0064757 | A1 * | 4/2003 | Yamadera et al. | 455/566 |
| 2005/0226595 | A1 * | 10/2005 | Kreifeldt et al. | 386/46 |
| 2005/0289454 | A1 * | 12/2005 | Donelson et al. | 715/513 |
| 2006/0098221 | A1 * | 5/2006 | Ferlitsch | 358/1.13 |
| 2008/0195649 | A1 * | 8/2008 | Lefebvre | 707/102 |

OTHER PUBLICATIONS

Using Cluster Analysis for deriving menu structures for automotive mobile multimedia applications, Toms et al, SAE Technical paper series, 2001.*
Model-Based evaluation of expert cell phone menu interaction, Amant et al, ACM Transaction on Computer-Human Interaction, vol. 14, No. 1, May 2007.*

* cited by examiner

*Primary Examiner* — Pierre M Vital
*Assistant Examiner* — Augustine Obisesan

(57) ABSTRACT

A method, computer system, and graphical user interface for generating firmware code for a programmable integrated circuit are disclosed. Embodiments are directed to a configurable menu hierarchy which is displayed as part of a graphical user interface, and therefore may be configured on-screen by a user interacting with elements or regions of the graphical user interface. Once the hierarchy of the menu is configured, a data structure for implementing menu functionality associated with the displayed menu hierarchy may be automatically generated. Firmware may be generated based upon the data structure and stored within a programmable integrated circuit. The firmware may enable the programmable integrated circuit to implement the menu functionality external to the programmable integrated circuit using at least one component of the programmable integrated circuit. The menu functionality may operate in conjunction with at least one user interface device of the electronic device.

21 Claims, 14 Drawing Sheets

METHOD, SYSTEM, AND GRAPHICAL USER INTERFACE FOR GENERATING FIRMWARE CODE FOR A PROGRAMMABLE INTEGRATED CIRCUIT

BACKGROUND OF THE INVENTION

Menus for electronic devices are used in a wide variety of applications, and are often implemented using integrated circuits. As one example, an automobile radio may use menus to present settings of the radio to a user, where the user can navigate through the menu to view and/or program various settings. The menu may be implemented using data stored in an integrated circuit of the radio.

Conventional methods for coding the data used to implement the menu involve hand coding. For example, manual entry of code is used to define the organization of the menu, the relationship of the nodes of the hierarchy, the menu's interaction with buttons of the device, the functionality executed by various nodes of the hierarchy, and the like. Since menus typically include many hierarchy levels with numerous nodes within each level, hand coding is labor-intensive, tedious, and costly. Additionally, hand coding is prone to error.

SUMMARY OF THE INVENTION

Accordingly, a need exists for a more efficient means of generating firmware code for implementing a menu. A need also exists for generation of such menu firmware code with less cost. Further, a need exists to generate firmware code for implementing an electronic device menu in a manner which is less prone to error. Embodiments of the present invention provide novel solutions to these needs and others as described below.

Embodiments of the present invention are directed to a method, computer system, and graphical user interface for generating firmware code for a programmable integrated circuit. More specifically, embodiments are directed to a configurable menu hierarchy which is displayed as part of a graphical user interface (e.g., of a design tool computer system), and therefore may be configured on-screen (e.g., by adding nodes, removing nodes, reorganizing nodes, moving nodes from one hierarchy level to another, editing the names of nodes, associating functions with the nodes, etc.) by a user interacting with elements or regions of the graphical user interface. Once the hierarchy of the menu is configured, a data structure for implementing menu functionality (e.g., on an electronic device) associated with the displayed menu hierarchy may be automatically generated (e.g., in response to interaction with the graphical user interface). Firmware may be generated based upon the data structure and stored within a programmable integrated circuit. The firmware may enable the programmable integrated circuit to implement the menu functionality (e.g., associated with the configurable menu hierarchy) external to the programmable integrated circuit (e.g., on a display screen of a device or system incorporating the programmable integrated circuit) using at least one component (e.g., a pin, memory, processor, etc. which may be configured or controlled by the firmware code to implement the menu) of the programmable integrated circuit. In one embodiment, the menu functionality may operate in conjunction with at least one user interface device, such as a display screen and a user input mechanism (e.g., a keyboard, at least one button, etc.) of the electronic device.

In one embodiment, a computer-implemented method of generating instructions and data includes accessing menu hierarchy data for a menu hierarchy and accessing menu hierarchy configuration data associated with a configuration of the menu hierarchy. A data structure is generated based upon the menu hierarchy data and the menu hierarchy configuration data. Instructions and data are automatically generated based upon the data structure, the instructions and data for storage within a programmable integrated circuit and further for implementing menu functionality in combination with at least one user interface device of an electronic device utilizing the programmable integrated circuit, the menu functionality based upon the menu hierarchy configuration data.

In another embodiment, a graphical user interface includes a configurable menu hierarchy including a plurality of nodes organized into at least two hierarchy levels, wherein the configurable menu hierarchy is based upon menu hierarchy data, wherein the plurality of nodes includes a parent node and at least one child node, and wherein the at least one child node includes a child node of the parent node. A first graphical object is for initiating generation of a data structure based upon the menu hierarchy data and menu hierarchy configuration data, wherein the menu hierarchy configuration data is related to a configuration of the configurable menu hierarchy, wherein the data structure is for generating firmware code for storage within the programmable integrated circuit, wherein the firmware code is further for implementing menu functionality in combination with a user interface device and in accordance with the menu hierarchy configuration data.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Figure 1:
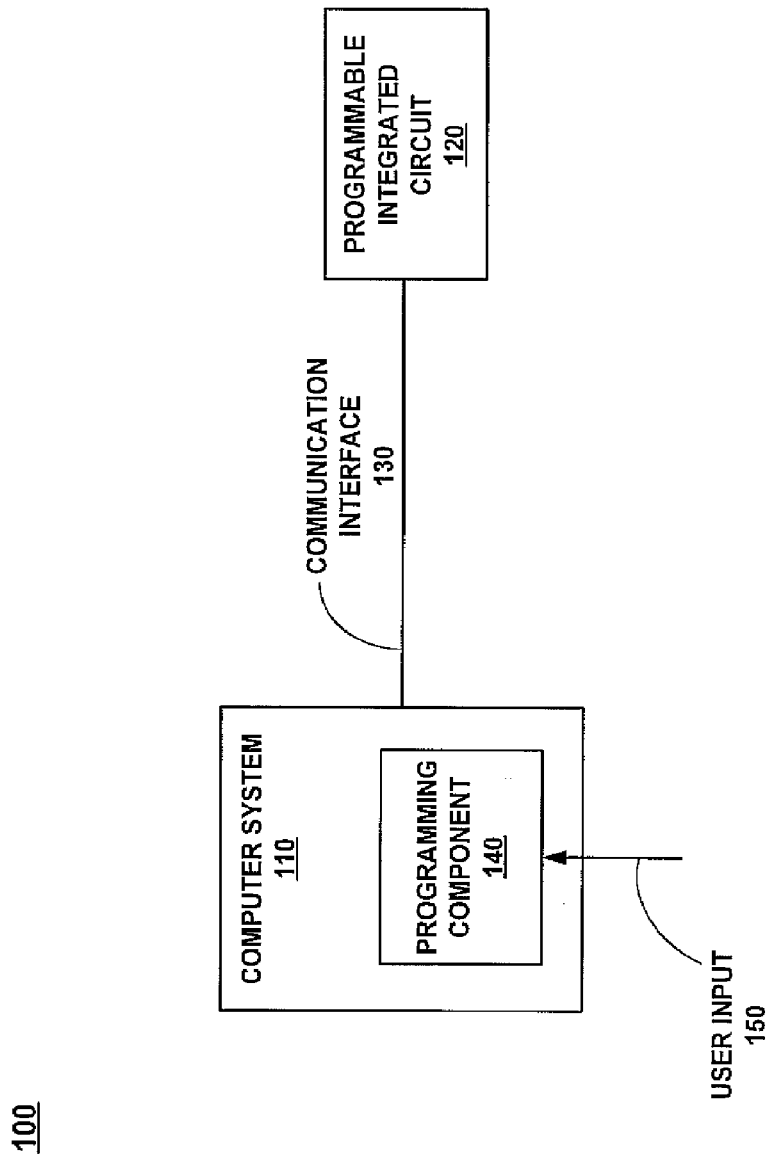
FIG. 1 shows an exemplary system for communicating with a programmable integrated circuit in accordance with one embodiment of the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Notation and Nomenclature

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "aborting," "accepting," "accessing," "adding," "adjusting," "altering," "analyzing," "applying," "assembling," "assigning," "balancing," "blocking," "calculating," "capturing," "combining," "comparing," "collecting," "creating," "debugging," "defining," "depicting," "detecting," "determining," "displaying," "enabling," "establishing," "executing," "flipping," "generating," "grouping," "hiding," "identifying," "initiating," "inserting," "interacting," "modifying," "monitoring," "moving," "outputting," "performing," "placing," "presenting," "processing," "programming," "querying," "removing," "repeating," "resuming," "sampling," "simulating," "sorting," "storing," "subtracting," "suspending," "tracking," "transcoding," "transforming," "unblocking," "using," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Invention

FIG. 1 shows exemplary system 100 for communicating with a programmable integrated circuit in accordance with one embodiment of the present invention. As shown in FIG. 1, computer system 110 is coupled to programmable integrated circuit 120 via communication interface 130 (e.g., a serial or parallel link), thereby enabling computer system 110 to communicate with programmable integrated circuit 120 (e.g., described with respect to FIGS. 2A and 2B). In one embodiment, programming component 140 (e.g., depicted in FIG. 3) may be used to generate data (e.g., firmware source code, other data, etc.) for programming programmable integrated circuit 120. Additionally, programming component may implement a design tool for programming, configuring, debugging, etc. the programmable integrated circuit (e.g., 120).

The data for programming the programmable integrated circuit (e.g., 120) may be generated in response to user inputs (e.g., 150) and/or data accessed by computer system 110 (e.g., stored within memory accessible to computer system 110). Thereafter, the data for programming programmable integrated circuit 120 may be uploaded or otherwise communicated over communication interface 130 to programmable integrated circuit 120 (e.g., for storage therein). The data may be subsequently accessed by programmable integrated circuit 120 (e.g., during a validation or testing stage while programmable integrated circuit 120 is still coupled to communication interface 130, during an operational stage after programming is complete and programmable integrated circuit 120 is no longer coupled to communication interface 130, etc.). In accordance with embodiments described herein, the data may include instructions for causing menu functionality to be implemented on the programmable integrated circuit, and wherein the programmable integrated circuit either contains or is coupled to user interface devices such as a display and a user input mechanism (e.g., a keyboard, at least one button, etc.).

Figure 2A:
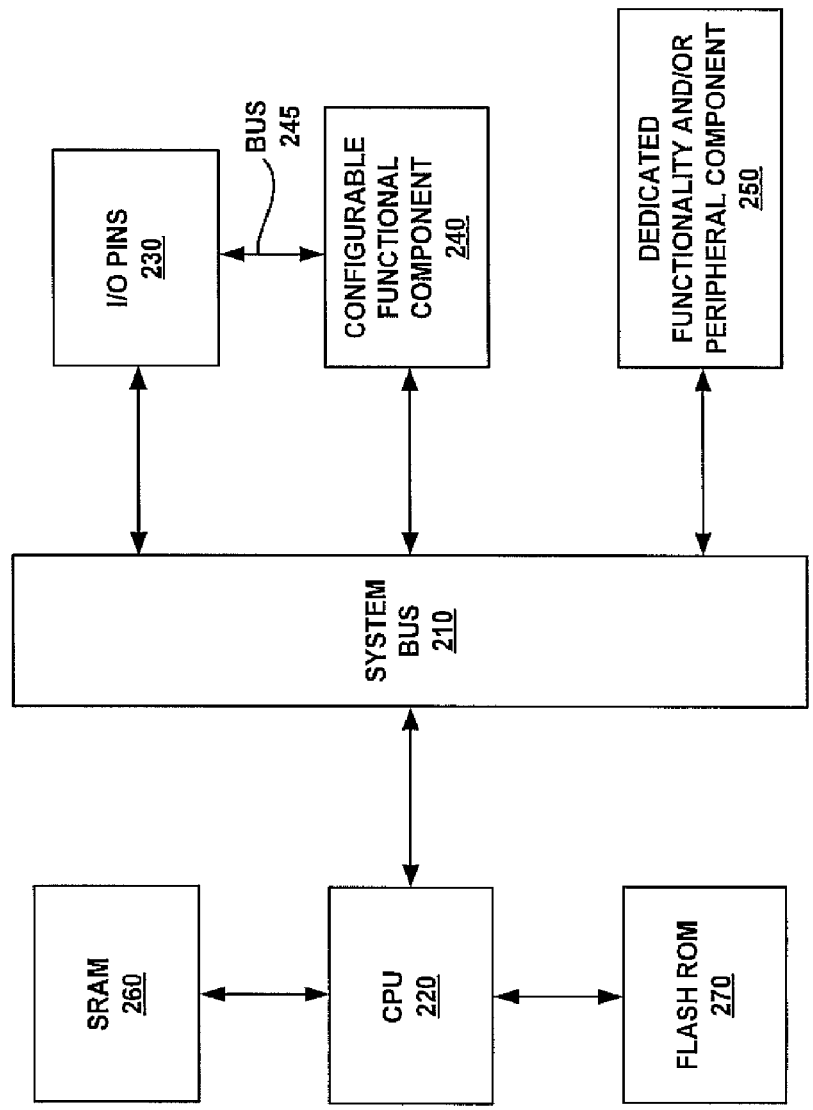
FIG. 2A is a block diagram showing an exemplary programmable integrated circuit in accordance with one embodiment of the present invention.

FIG. 2A is a block diagram showing exemplary programmable integrated circuit 120 in accordance with one embodiment of the present invention. As shown in FIG. 2A, system bus 210 couples central processing unit (CPU) or microprocessor 220, input/output (I/O) pins 230, configurable functional component 240, and dedicated functionalities and/or peripheral component 250. Static random access memory (SRAM) 260 and/or flash read only memory (ROM) 270 may be coupled to CPU 220. Additionally, I/O pins 230 and configurable functional component 240 may be alternatively coupled (e.g., via bus 245) in one embodiment. Although programmable integrated circuit 120 can be any programmable device, in one embodiment, programmable integrated circuit 120 may be a programmable system on a chip (PSoC) or a programmable microcontroller.

Flash ROM 270 may store firmware code and/or other data in one embodiment. The firmware code may be used by programmable integrated circuit 120 to implement configurations of one or more components (e.g., 230, 240, 250, etc.) and/or to control the operation of CPU 220. For example, the firmware code (e.g., stored in flash ROM 270) may be used to configure various programmable analog and/or digital blocks of component 240 to implement certain functionality (e.g., an analog-to-digital converter, digital-to-analog converter, counter, etc.), where I/O pins 230 may be coupled to the analog and/or digital blocks (e.g., in accordance with I/O pin designation data accessed during execution of the firmware code) via various programmable routing resources to provide inputs and/or outputs to the implemented functionality. Additionally, during execution of the firmware code (e.g., by CPU 220), SRAM 260 may store volatile and/or temporary data (e.g., accessed by one or more components of programmable integrated circuit 120).

Figure 2B:
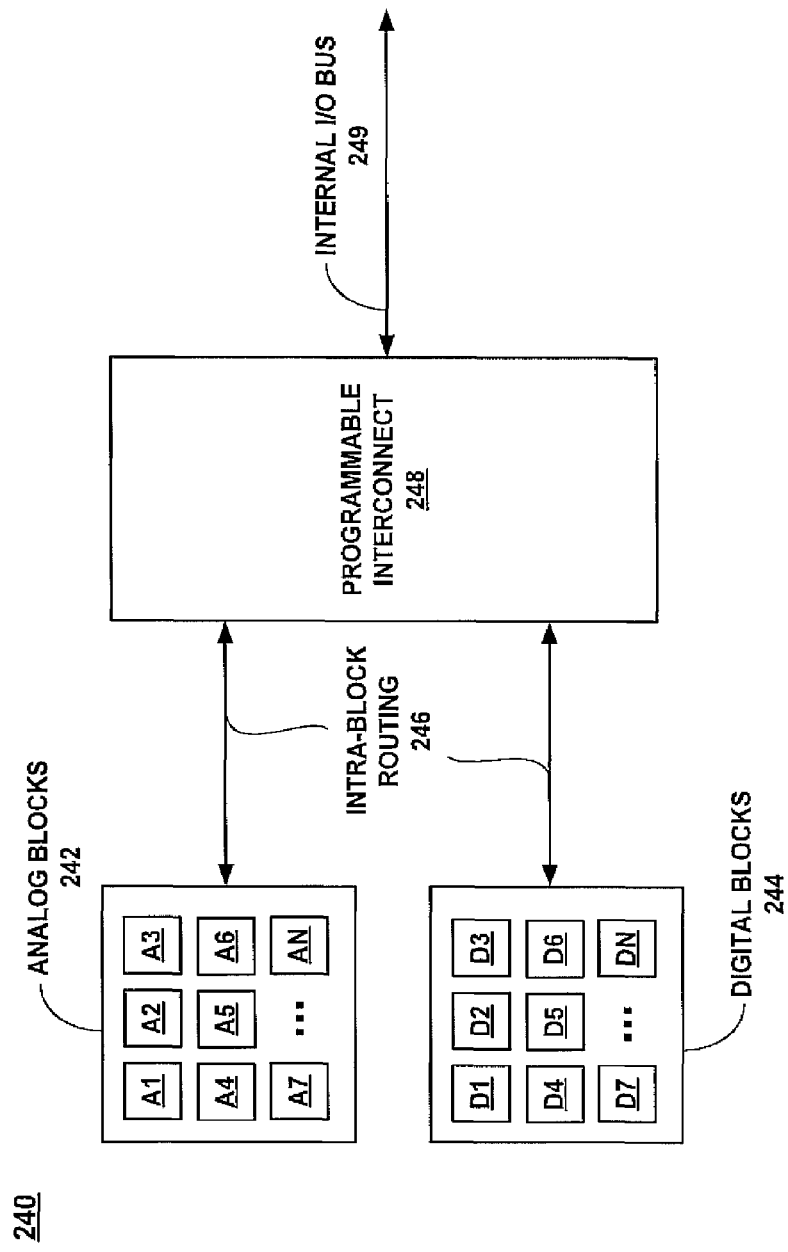
FIG. 2B shows an exemplary configurable functional component in accordance with one embodiment of the present invention.

FIG. 2B shows exemplary configurable functional component 240 in accordance with one embodiment of the present invention. As shown in FIG. 2B, component 240 comprises analog blocks 242, digital blocks 244, and programmable interconnect 248. Analog blocks 242 include a matrix of interconnected analog functional blocks A1 through AN. Additionally, digital blocks 244 include a matrix of interconnected digital functional blocks D1 through DN. It should be appreciated that analog blocks 242 and/or digital blocks 244 may comprise any number of functional blocks.

Analog blocks 242 (e.g., A1 through AN) and digital blocks 244 (e.g., D1 through DN) are fundamental building blocks (e.g., fundamental circuits) that may be combined in a variety of configurations (e.g., using programmable interconnect and intra-block routing 246) to accomplish a variety of functions. Additionally, different combinations of blocks implementing different functions may exist at different times within the same system. For example, a set of functional blocks configured to perform the function of analog-to-digital conversion may sample a signal (e.g., accessed via internal I/O bus 249). After processing the data (e.g., accessed via internal I/O bus 249) in the digital domain, some or all of those same blocks (perhaps in conjunction with others) may be recombined in a different configuration to perform the function of digital-to-analog conversion (e.g., on data accessed via internal I/O bus 249) to produce an output signal (e.g., output via internal I/O bus 249).

In one embodiment, the programmable configuration of programmable integrated circuit 120 is facilitated by memory (e.g., configuration registers) and/or logic (e.g., one or more selectable logic circuits) included in the integrated circuit. The memory may include configuration registers that store a series of logical values (e.g., logical 1 or 0 corresponding to a predetermined voltage level) corresponding to a particular configuration and/or function for implemented using one or more components (e.g., analog blocks 242, digital blocks 244, etc.) of programmable integrated circuit 240. The series of logic values may be programmably configured (e.g., using the selectable logic circuits) before operation and/or during operation (e.g., on-the-fly).

The logical values loaded into a configuration register may be defined by a configuration image (e.g., stored in a memory of programmable integrated circuit 120) in one embodiment. The information comprising the configuration image may be represented in varying degrees of abstraction. For example, at a low level of abstraction, the configuration image may be represented by source code (e.g., assembly or machine language) stored as logical values (e.g., logical ones and zeroes) in a memory (e.g., of programmable integrated circuit 120). At a higher lever of abstraction, the configuration image may be represented by textual definitions or graphical images (e.g., input to and/or accessed by a design tool such as those depicted in FIGS. 3 and 5-7 of the present application).

Although FIG. 2A shows programmable integrated circuit 120 with specific components, it should be appreciated that programmable integrated circuit 120 may comprise different and/or additional components in other embodiments. It should also be appreciated configurable functional component 240 as depicted in FIG. 2B may comprise different and/or additional components in different embodiments. Additionally, it should be appreciated that components of programmable integrated circuit 120 and/or configurable functional component 240 may be alternatively coupled and/or configured in other embodiments. And in one embodiment, programmable integrated circuit 120 and/or configurable functional component 240 may be implemented as described in U.S. Pat. No. 6,971,004, which is hereby incorporated by reference in its entirety.

Figure 3:
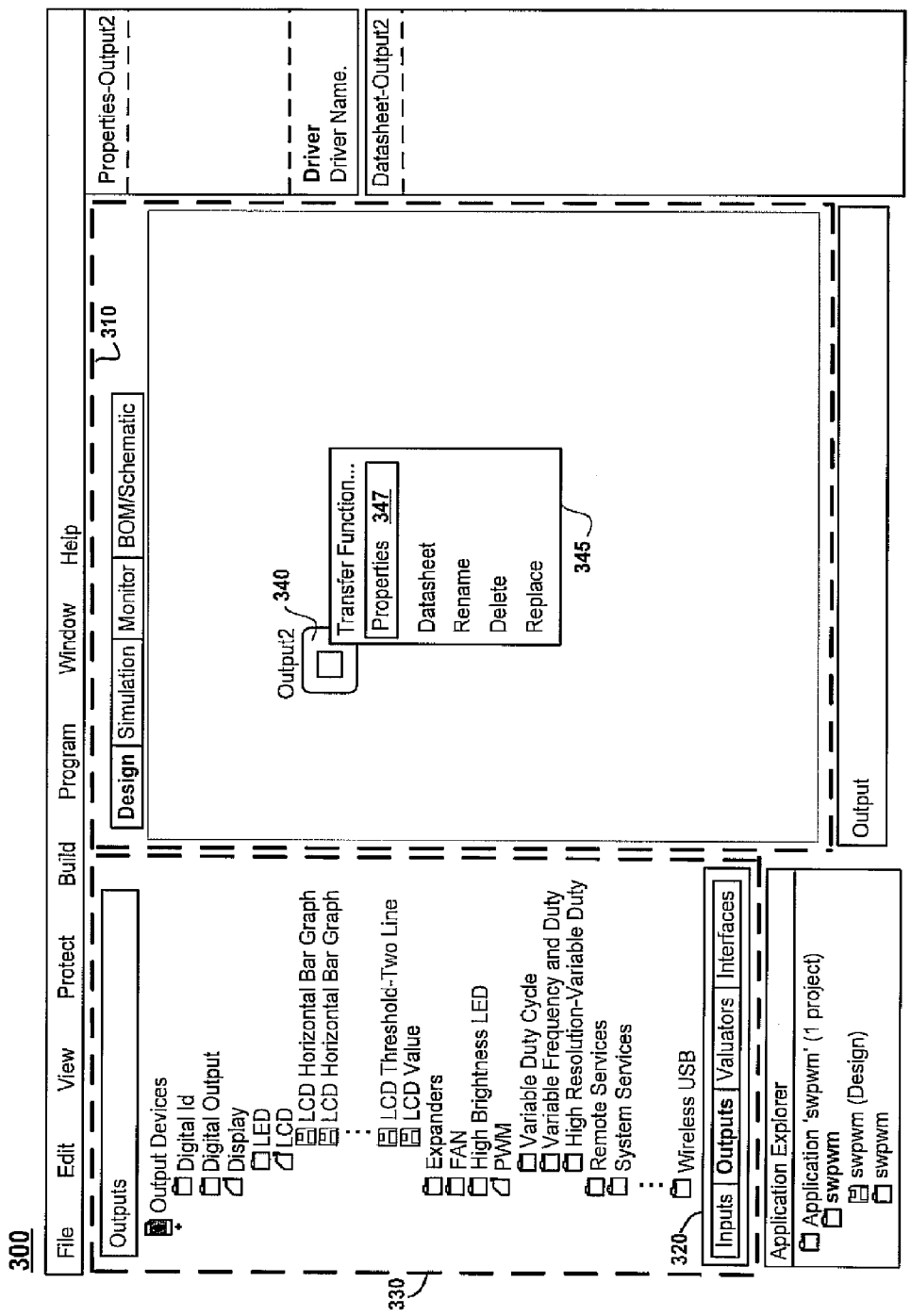
FIG. 3 shows an exemplary graphical user interface for implementing a programming component in accordance with one embodiment of the present invention.

FIG. 3 shows exemplary graphical user interface (GUI) 300 for implementing programming component 140 in accordance with one embodiment of the present invention. In this manner, GUI 300 may be implemented by computer system 110 in one embodiment. As shown in FIG. 3, GUI 300 comprises region 310 for creating a design for a target device (e.g., 120). For example, tabs 320 may be used to select a type of design component to add to a design, where design components (e.g., inputs, outputs, valuators, interfaces, other design components, etc.) related to the selected design component type may be displayed in region 330. A design component may be added to a design, in one embodiment, by dragging and dropping a selected design component into region 310. For example, icon 340 may represent a design component (e.g., an output for the design, an input for the design, etc.) selected from region 330. Alternatively, design components may be alternatively selected and added to the design (e.g., from a menu, selectable list-box, etc.).

After design components have been added to the design (e.g., by dragging and dropping into region 310), the design components may be configured. For example, a user may initiate menu 345 (e.g., by moving a mouse cursor over icon 340 and clicking a mouse button) for configuring the design component associated with icon 340 (e.g., specifying operating parameters of the design component, etc.), for configuring other portions of the design (e.g., how the design component associated with icon 340 couples to, interfaces with, or otherwise relates to other components of the design), etc. Thereafter, the design may be "built" or compiled to generate code (e.g., firmware code) for enabling the programmable integrated circuit (e.g., 120) to implement the design.

GUI 300 may also be used to monitor and/or control the design (e.g., in real time) while the target device is operating. In one embodiment, component 140 may implement a simulator for simulating the design, and therefore, GUI 300 may present information related to a simulation of the design and/or enable users to interact with the simulation (e.g., via inputs 150). In another embodiment, component 140 may implement an emulator (e.g., an in-circuit emulator) for debugging or performing other emulation tasks for the programmable integrated circuit (e.g., 120) coupled to programming component 140. In this manner, GUI 300 may be used to present information about the emulation of the design (e.g., being executing on or otherwise implementing using programmable integrated circuit 120) and/or enable users to interact with the emulation (e.g., via inputs 150).

Figure 4A:
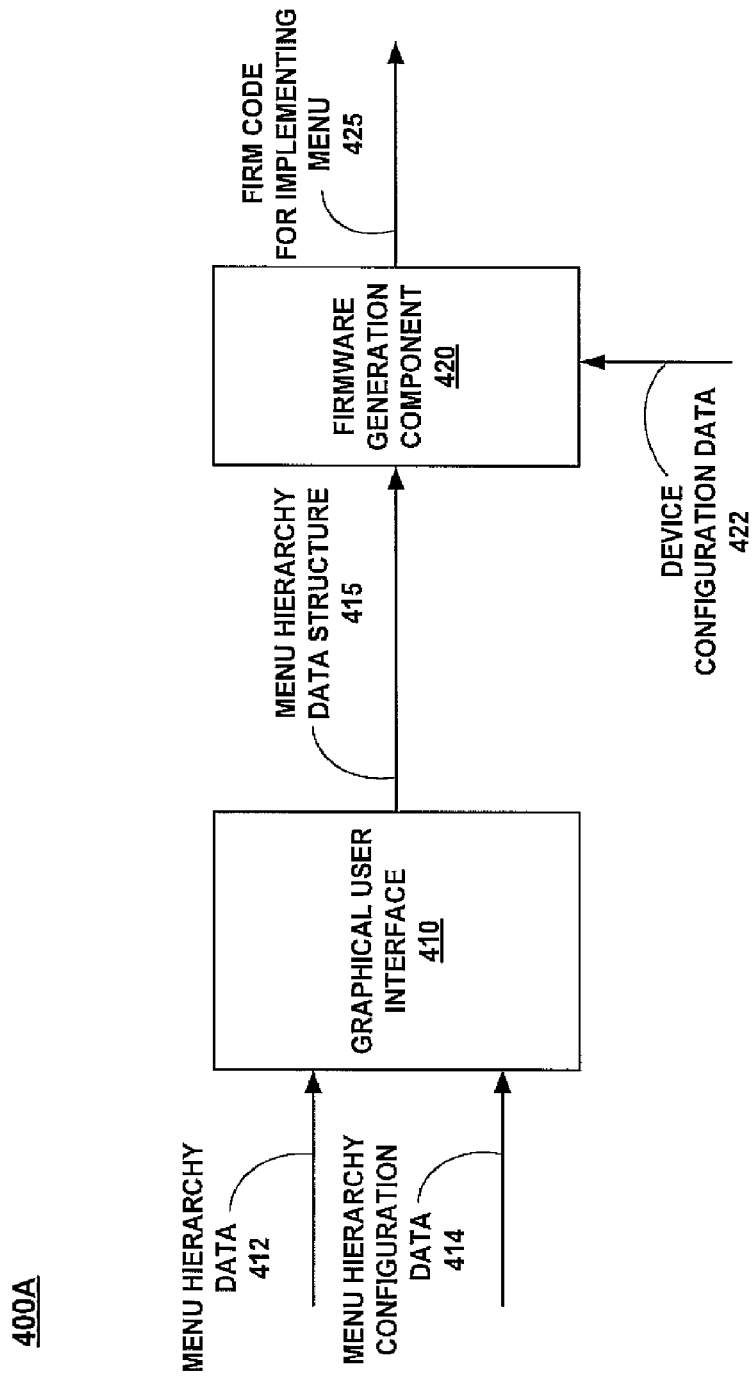
FIG. 4A shows a data flow diagram for automated generation of firmware for access by a programmable integrated circuit in accordance with one embodiment of the present invention.

FIG. 4A shows data flow diagram 400 for automated generation of firmware for access by a programmable integrated circuit in accordance with one embodiment of the present invention. As shown in FIG. 4A, firmware generation component 420 may generate firmware for access by a programmable integrated circuit (e.g., 120), where the firmware code (e.g., 425) may enable the programmable integrated circuit to implement menu functionality (e.g., using a display and at least one user input mechanism as described with respect to FIG. 4B). In this manner, the firmware code (e.g., 425) may be included in or otherwise enable implementation of an embedded application for execution for the programmable integrated circuit (e.g., 120). For example, where the programmable integrated circuit is used to control a thermostat with a display screen, the firmware code (e.g., 425) may implement a menu for viewing and/or adjusting settings of the thermostat displayed on the display screen. Additionally, buttons (e.g., mechanically-actuated buttons or keys, soft buttons of a graphical user interface, etc.) of the thermostat may be used in this example as the user input mechanism to interact with the menu functionality implemented using programmable integrated circuit 120.

The firmware used to implement the menu functionality may be automatically generated by firmware generation component 420 based upon a menu hierarchy data structure (e.g., 415) and device configuration data 422. Menu hierarchy data structure 415 may be generated using GUI 410 (e.g., depicted in FIGS. 5-7) based upon menu hierarchy data 412 (e.g., comprising a template for the menu hierarchy) and menu hierarchy configuration data 414 (e.g., comprising information to fill in and/or modify the template of menu hierarchy data 412), where GUI 410 may be launched from GUI 300 (e.g., by interacting with menu item 347 of menu 345) in one embodiment. Alternatively, device configuration data 422 may be generated based upon interaction with GUI 300. For example, device configuration data 422 may be based upon design components placed in region 310, configuration settings for one or more design components entered using GUI 300 or other GUIs (e.g., 410) launched from GUI 300, etc.

It should be appreciated that menu hierarchy data 412, menu hierarchy configuration data 414, menu hierarchy data structure 415, and/or firmware code 425 may be associated with a single-level or flat menu structure in one embodiment. For example, menu hierarchy data 412 may be used to present a configurable hierarchy with one level. Menu hierarchy configuration data 414 may be associated with configuration or modification of a single-level menu structure (e.g., displayed on a GUI for configuring the menu structure). In one embodiment, menu hierarchy data structure 415 may represent or otherwise be used to implement menu functionality associated with a single-level or flat menu structure (e.g., using a programmable integrated circuit). Firmware code 425 may be used to implement a single-level or flat menu structure (e.g., using a programmable integrated circuit).

Figure 4B:
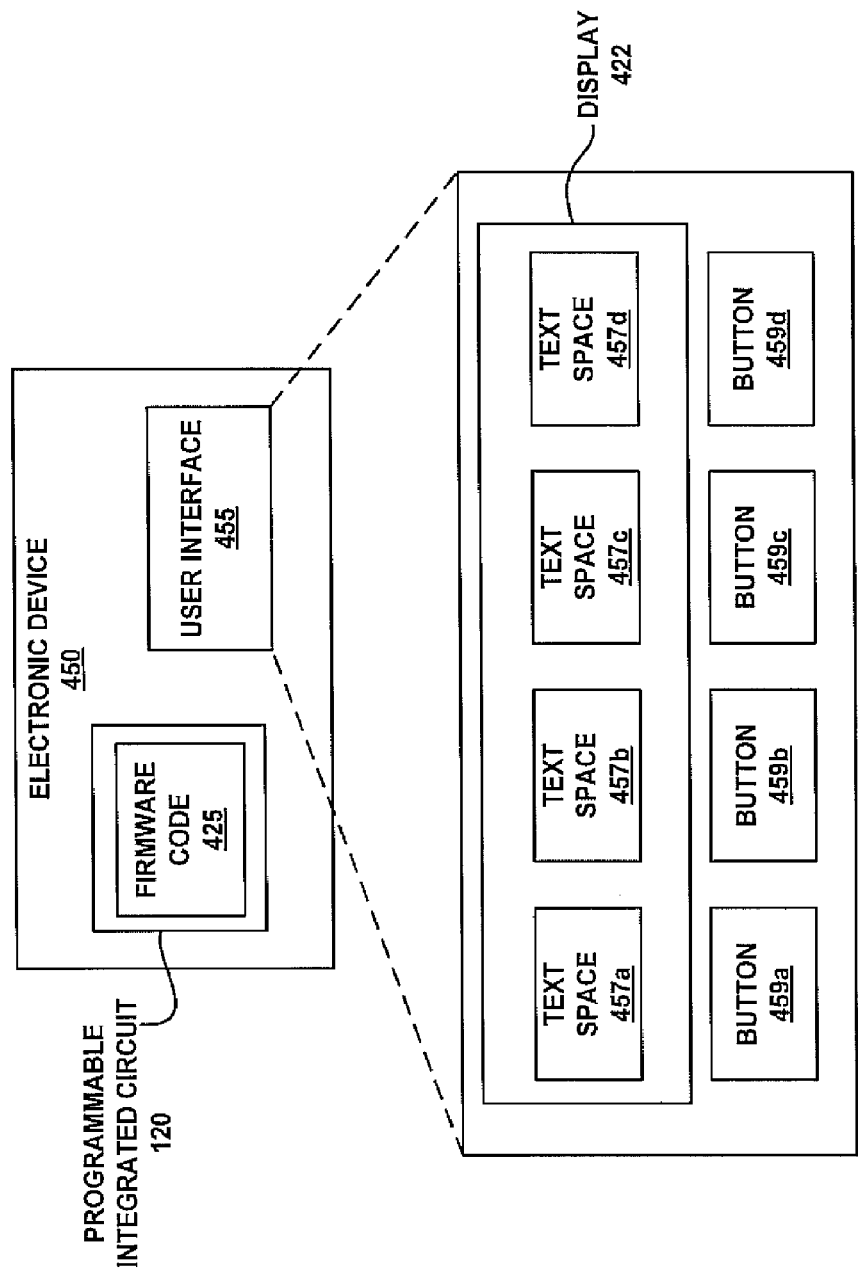
FIG. 4B shows an exemplary electronic device implementing exemplary menu functionality in accordance with one embodiment of the present invention.

FIG. 4B shows exemplary electronic device 450 implementing exemplary menu functionality in accordance with one embodiment of the present invention. As shown in FIG. 4B, electronic device 450 includes programmable integrated circuit 120 and user interface 455, where electronic device 450 may be a thermostat or other environmental control system, a printer, or other electronic device. Programmable integrated circuit 120 includes firmware 425 for implementing menu functionality (e.g., related to menu hierarchy data structure 415).

User interface 455 includes a display (e.g., 422) and at least one user input device (e.g., buttons 459a-459d). Additionally, display 422 is operable to present or display text spaces 457a-457d that may be used to display text and/or graphical objects in one embodiment. Although FIG. 4B shows user interface 455 with specific exemplary features (e.g., display 422 with text spaces 457a-457d, buttons 459a-459d, etc.), it should be appreciated that user interface 455 may be alternatively configured (e.g., with a different number of buttons, with soft buttons displayed on display 422, with more than one display, etc.) in other embodiments.

In one embodiment, text spaces 457a-457d may correspond to respective buttons 459a-459d (e.g., text space 457a may correspond to button 459a, text space 457b may correspond to button 459b, etc.), and each of buttons 459 may correspond to a node of the configurable hierarchy (e.g., defined by menu hierarchy data structure 415, contained within firmware 425, etc.). The association of hierarchy nodes to components of the programmable integrated circuit (e.g., 120) and/or an electronic device (e.g., 450) incorporating the programmable integrated circuit (e.g., 120) may be defined by device configuration data (e.g., 422 entered into GUI 300) in one embodiment. For example, where the word "Settings" is displayed in text space 457a and the words "Power Down" are displayed in text space 457b, then interaction with button 459a may initiate display of settings (e.g., in text spaces 457a-457d) corresponding to electronic device 450 (e.g., thereby repurposing buttons 459a-459d to correspond to the displayed settings) while interaction with button 459b may instead initiate a function (e.g., execution of code for implementing the function, etc.) for powering down electronic device 450. It should be appreciated that each of the settings displayed using text spaces 457a-457d, for example, may be related to nodes of the configurable hierarchy (e.g., defined by menu hierarchy data structure 415, contained within firmware 425, etc.) which are on the same hierarchy level and are child nodes of a parent node related to the "settings" menu functionality (e.g., displayed previously in text space 457a and corresponding previously to button 459a).

In other embodiments, text spaces 457a-457d and/or buttons 459a-459d may relate to other nodes of the configurable hierarchy. For example, the nodes related to text spaces 457a-457d and/or buttons 459a-459d may be on different hierarchy levels of the configurable hierarchy. And in other embodiments, the functionality of the nodes may be different (e.g., all the text spaces and/or buttons may be related to executing functions, all the text spaces and/or buttons may be related to pulling up sub-menus (e.g., child menus), a different number of the text spaces and/or buttons may be dedicated to executing functions and/or presenting sub-menus, etc.).

Figure 5A:
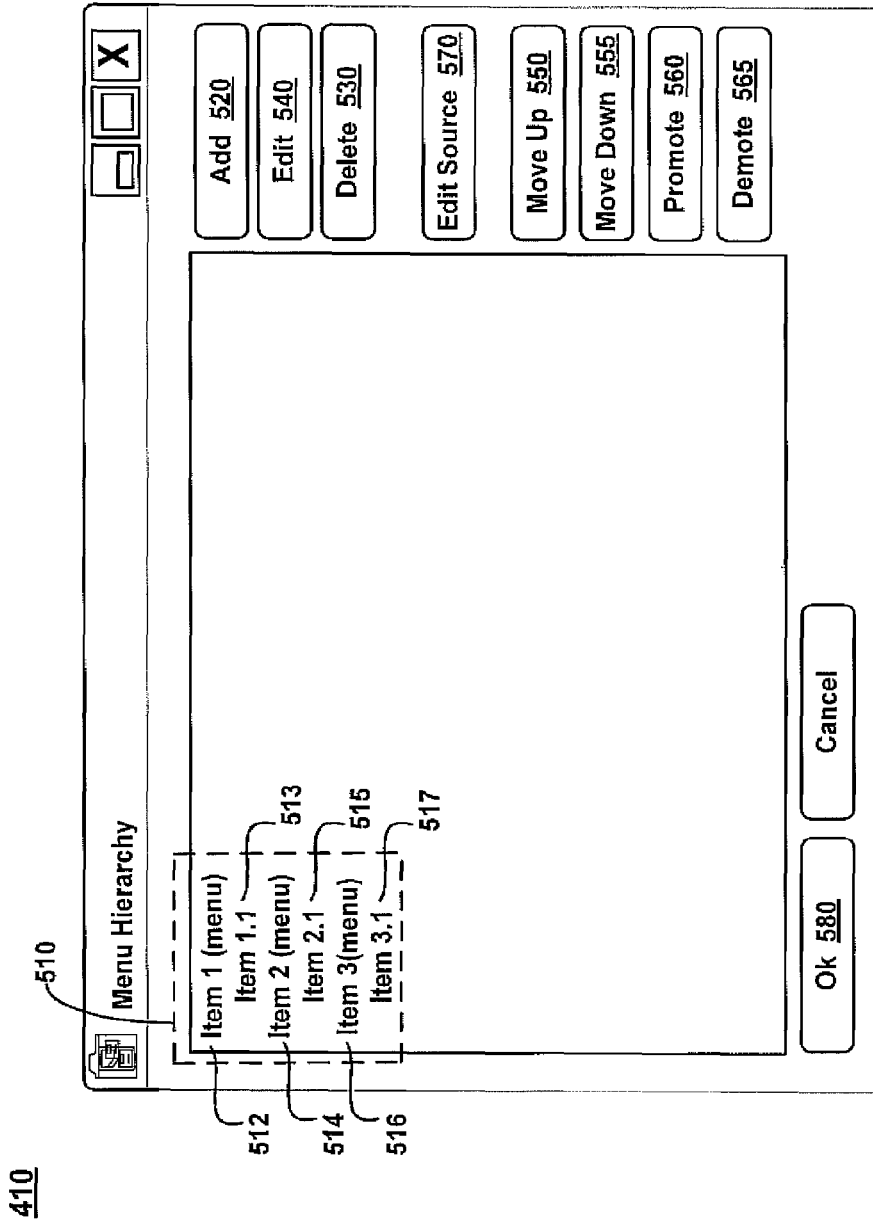
FIG. 5A shows an exemplary on-screen graphical user interface for presenting a configurable menu hierarchy in accordance with one embodiment of the present invention.

FIG. 5A shows exemplary on-screen GUI 410 for presenting a configurable menu hierarchy in accordance with one embodiment of the present invention. As shown in FIG. 5A, configurable menu hierarchy 510 includes a first hierarchy level (e.g., with nodes 512, 514 and 516) and a second hierarchy level (e.g., with nodes 513, 515 and 517). Node 513 is a child node of node 512, node 515 is a child node of node 514, and node 517 is a child node of node 516. In this manner, nodes (e.g., 512, 514 and 516) of the first hierarchy level are parent nodes of the nodes (e.g., 513, 515 and 517) of the second hierarchy level.

GUI 410 includes various graphical objects for configuring configurable menu hierarchy 510. For example, interaction with graphical object 520 (e.g., moving a mouse cursor over graphical object 520 and pressing a mouse button, pressing a region of a touch screen corresponding to graphical object 520, etc.) may add a node to configurable menu hierarchy 510. Interaction with graphical object 530 (e.g., moving a mouse cursor over graphical object 530 and pressing a mouse button, pressing a region of a touch screen corresponding to graphical object 530, etc.) may remove a node (e.g., a highlighted or otherwise selected node) of configurable menu hierarchy 510. Graphical object 540 may be used to change a name of a node (e.g., a highlighted or otherwise selected node) of configurable menu hierarchy 510).

Additionally, interaction with graphical object 550 may move a node (e.g., a highlighted or otherwise selected node) upward within a given hierarchy level. For example, if a child node were added to node 516 below child node 517, then interaction with graphical object 550 may move the added node above node 517. And in one embodiment, further interaction with graphical object 550 may move the added node to the next parent node (e.g., node 514) within the same hierarchy level (e.g., between nodes 515 and 516). Alternatively, further interaction with graphical object 550 may not move the added node once it reaches the top of the list of child nodes pertaining to that parent node (e.g., 516), thereby leaving the added node between nodes 516 and 517 in one embodiment.

As shown in FIG. 5A, interaction with graphical object 555 may move a node (e.g., a highlighted or otherwise selected node) downward within a given hierarchy level. For example, if a child node were added to node 516 below child node 517, then interaction with graphical object 555 may move node 517 below the added node. And in one embodiment, further interaction with graphical object 555 may move node 517 to the next parent node (e.g., another parent node added below parent node 516, parent node 512, etc.) within the same hierarchy level (e.g., between the next parent node and the first item node of that parent node). Alternatively, further interaction with graphical object 555 may not move node 517 once it reaches the bottom of the list of child nodes pertaining to that parent node (e.g., parent node 516), thereby leaving node 517 below the added node in one embodiment.

Interaction with graphical object 560 may move a node to a higher hierarchy level, thereby "promoting" the node to the higher hierarchy level. For example, interaction with graphical object 560 while node 517 is selected (e.g., highlighted, etc.) may move node 517 from the second hierarchy level to the first hierarchy level, thereby creating a fourth node in the first hierarchy level (e.g., along with nodes 512, 514 and 516). In one embodiment, such promoting (e.g., using graphical object 560) may change node 517 from a node associated with execution of a function to a node associated with a sub-menu. Alternatively, node 517 may be moved or promoted to a higher hierarchy level (e.g., that associated with nodes 512, 514 and 516) and remain a node associated with execution of a function.

Interaction with graphical object 565 may move a node to a lower hierarchy level, thereby "demoting" the node to the lower hierarchy level. For example, interaction with graphical object 565 while node 516 is selected (e.g., highlighted, etc.) may move node 516 from the first hierarchy level to the second hierarchy level, thereby making node 516 a child node of node 514 in one embodiment. Additionally, movement of node 516 to a lower hierarchy level (e.g., along with node 515) may also make node 517 a child node of node 514 in one embodiment, thereby providing node 514 with three child nodes (e.g., 515-517). In one embodiment, such demoting (e.g., using graphical object 565) may change node 516 from a node associated with a sub-menu to a node associated with execution of a function. Alternatively, node 516 may be moved or demoted to a lower hierarchy level (e.g., that associated with nodes 513, 515 and 517) and remain a node associated with a sub-menu.

As shown in FIG. 5A, interaction with graphical object 570 may enable association of a function or other executable code with a node (e.g., a highlighted or otherwise selected node). The function or executable code may be executed in response to interaction with a menu element (e.g., a button or other user interface device of a device implementing the menu functionality and incorporating or utilizing programmable integrated circuit 120) associated with the selected node of configurable menu hierarchy 510. A function may be supplied by entering code for implementing the function into a pop-up box or window (e.g., displayed in response to interaction with graphical object 570). Alternatively, a function may be identified or selected from a menu, selectable list-box, or the like (e.g., displayed in response to interaction with graphical object 570).

Nodes of configurable menu hierarchy 510 which are associated with functions or other executable code may implement "item nodes" within menu hierarchy data structure 415 and/or firmware code 425. In contrast, nodes which are not associated with functions or executable code may implement "menu nodes" within menu hierarchy data structure 415 and/or firmware code 425. Accordingly, while interaction with a menu element (e.g., a button or other user interface device of device 450 implementing the menu functionality and incorporating or utilizing programmable integrated circuit 120) associated with an item node may initiate execution of a function, interaction with a menu element associated with a menu node may present or display (e.g., on display 422) a sub-menu (e.g. in text spaces 457a-457d). Menu elements of the sub-menu may correspond to child nodes (e.g., of configurable menu hierarchy 510) of the parent node (e.g., of configurable menu hierarchy 510), where the parent node corresponds to the menu node.

Turning back to FIG. 4A, menu hierarchy data 412 may comprise a template or starting point for the configuration of configurable menu hierarchy 510. In this manner, the template (e.g., menu hierarchy data 412) may be accessed by GUI 410 and used to display configurable menu hierarchy 510 in one embodiment. Thereafter, menu hierarchy configuration data 414 may be input to GUI 410 during configuration of configurable interactive hierarchy 510, where the menu hierarchy configuration data 414 may comprise changes to the arrangement or organization of hierarchy 510 (e.g., through interaction with any of graphical objects 520-565) and/or addition of functions or executable code to one or more nodes of hierarchy 510 (e.g., through interaction with graphical object 570).

In one embodiment, GUI 410 may combine the menu hierarchy data (e.g., 412) and the menu hierarchy configuration data (e.g., 414) in response to interaction with graphical object 580. For example, the template (e.g., menu hierarchy data 412) may comprise placeholders for configuration data 414 (e.g., portions of code which may be filled with configuration data 414, portions of code which may be modified using configuration data 414, etc.), where GUI 410 may insert the configuration data (e.g., 414) into the appropriate place holders in response to interaction with graphical object 580 in one embodiment. For example, a function which is supplied (e.g., using graphical object 570) and associated with node 513 may be inserted into a placeholder in the template (e.g., data 412) in response to an interaction with graphical object 580. As another example, a node name, node hierarchy level, etc. may be supplied using GUI 410 (e.g., graphical objects 520-565) and placed into menu node and/or function node placeholders for the respective information (e.g., code tags or parameters relating to the node name, node hierarchy level, etc.).

Menu hierarchy data 412 may be coded in XML, C, C++, or another programming language. For example, menu hierarchy data 412 may be represented by the following exemplary XML code in one embodiment:

```
<Menu Title="Item 1" Child="Item 1.1">
<Menu_Item Title="Item 1.1" Function="Item 1.1 Func-
  tion">
  <Function Name="Item 1.1 Function">
    <function placeholder>
  </Function>
</Menu_Item>
</Menu>
<Menu Title="Item 2" Child="Item 2.1">
<Menu_Item Title="Item 2.1" Function="Item 2.1 Func-
  tion">
  <Function Name="Item 2.1 Function">
    <function placeholder>
  </Function>
</Menu_Item>
</Menu>
<Menu Title="Item 3" Child="Item 3.1">
<Menu_Item Title="Item 3.1" Function="Item 3.1 Func-
  tion">
  <Function Name="Item 3.1 Function">
    <function placeholder>
  </Function>
</Menu_Item>
</Menu>
```

Additionally, menu hierarchy data 412 may also comprise pointers to other portions of the hierarchy. For example, a menu node may comprise a pointer to its child nodes. Similarly, an item node may comprise a pointer to an associated function (e.g., a function pointer). And in other embodiments, it should be appreciated that menu hierarchy data 412 may be alternatively represented (e.g., as a database, a comma-delimited text file, a spreadsheet, etc.).

Menu hierarchy data 412 may include menu navigation code in one embodiment. The menu navigation code may handle inputs relating to nodes of the menu (e.g., presses of buttons of a device incorporating programmable integrated circuit 120 and implementing the menu), updating of the presented menu (e.g., on a display of a device incorporating programmable integrated circuit 120 and implementing the menu) in response to an input (e.g., a button press), executing functions (e.g., associated with a node during entry of configuration information using graphical object 570) related to nodes of the menu (e.g., implemented using programmable integrated circuit 120), etc. The menu navigation code may also handle returning an indicator of menu status (e.g., of the menu implemented using programmable integrated circuit 120) to the calling function (e.g., a function associated with a node during entry of configuration information using graphical object 570).

As shown in FIG. 4A, menu hierarchy configuration data 414 and/or menu hierarchy data structure 415 may be coded in XML, C, C++, or another programming language. It should be appreciated that menu hierarchy configuration data 414 and/or menu hierarchy data structure 415 may be alternatively represented (e.g., as a database, a comma-delimited text file, a spreadsheet, etc.). Further, it should be appreciated that menu hierarchy data 412, menu hierarchy configuration data 414, menu hierarchy data structure 415, or some combination thereof may be coded in different languages and/or represented by data in different forms. As such, it should be appreciated that one or more translation operations may be performed during the generation of menu hierarchy data structure 415. For example, where data structure 415 is to be stored in C, data 412 is in XML and configuration data 414 is stored in C, then configuration data may be translated to XML for combining with data 412 in one embodiment. The resulting data may then be translated to C to generate data structure 415. In other embodiments, no translations may be performed when generating data structure 415.

Turning again to FIG. 5A, it should be appreciated that GUI 410 may impose rules or restrictions on the configuration of configurable menu hierarchy 510. The rules or restrictions may include a maximum number of items allowed in a menu, a maximum size allowed for a menu title, a maximum size allowed for an item title, a maximum number of levels in the hierarchy (e.g., 510), etc. The rules or restrictions may relate to limitations of GUI 410 in one embodiment. Alternatively, the rules or restrictions may be application-specific rules or restrictions, thereby relating to limitations of a device or system which implements the menu (e.g., a device or system incorporating programmable integrated circuit 120 and using programmable integrated circuit 120 to implement the menu).

Although FIG. 5A shows GUI 410 with graphical objects (e.g., 520-580) in a specific configuration, it should be appreciated that the graphical objects may be alternatively arranged in other embodiments. Additionally, it should be appreciated that the graphical objects may have a different appearance (e.g., be placed in a menu or selectable list box, etc.) in other embodiments.

Figure 5B:
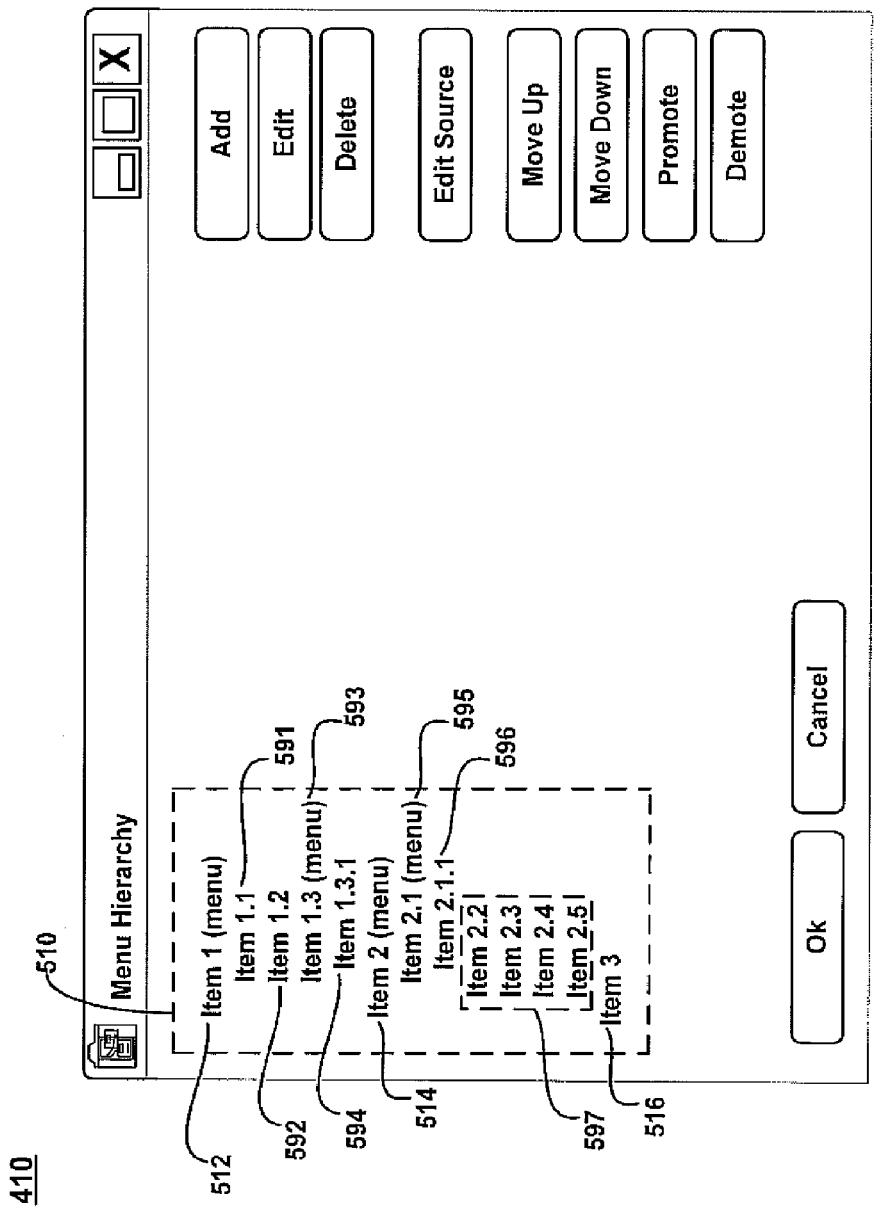
FIG. 5B shows an exemplary on-screen GUI for presenting a configurable menu hierarchy with additional nodes in accordance with one embodiment of the present invention.

FIG. 5B shows exemplary on-screen GUI 410 for presenting configurable menu hierarchy 510 with additional nodes in accordance with one embodiment of the present invention. As shown in FIG. 5B, configurable menu hierarchy 510 may include nodes 512, 514 and/or 516 on a first (e.g., top) hierarchy level, a plurality of nodes (e.g., nodes 591-593, 595, and 597) on a second hierarchy level (e.g., below the first hierarchy level), and at least one node (e.g., 594 and 596) on a third hierarchy level (e.g., below the second hierarchy level). It should be appreciated that the nodes of configurable hierarchy 510 as depicted in FIG. 5B may be nodes associated with a sub-menu or child menu (e.g., for causing the display of the sub-menu in response to interaction with the node) and/or associated with an executable function (e.g., for causing execution of the function in response to interaction with the node). For example, node 593 may be associated with a sub-menu such that interaction with a user input mechanism (e.g., buttons 459a-459d) of an electronic device (e.g., 450 which implements menu functionality associated with configurable menu hierarchy 510) may cause the display of information (e.g., text) associated with child node 594 and/or association of a button (e.g., 459a-459d) with child node 594 (e.g., for causing the execution of a function associated with child node 594 in response to interaction with the button). As another example, node 592 may be associated with an executable function such that interaction with a user input mechanism (e.g., buttons 459a-459d) of an electronic device (e.g., 450 which implements menu functionality associated with configurable menu hierarchy 510) may cause the execution of the function associated with node 592.

Although FIGS. 5A and 5B depict various configurations of configurable menu hierarchy 510, it should be appreciated that hierarchy 510 may have other configurations (e.g., a different number of nodes, organization of the nodes, etc.) in other embodiments. As another example, configurable menu hierarchy 510 may be a single-level or flat menu structure (e.g., comprising at least one node associated with execution of a function and/or at least one node associated with presentation or display of a sub-menu) in one embodiment. The other configurations may be presented using GUI 410 in response to user interaction with GUI 410 (e.g., with no template or initial menu hierarchy data 412, with a different template or menu hierarchy data 412, etc.), display of configurable menu hierarchy 510 using a different template or menu hierarchy data (e.g., 412), or some combination thereof.

Figure 6:
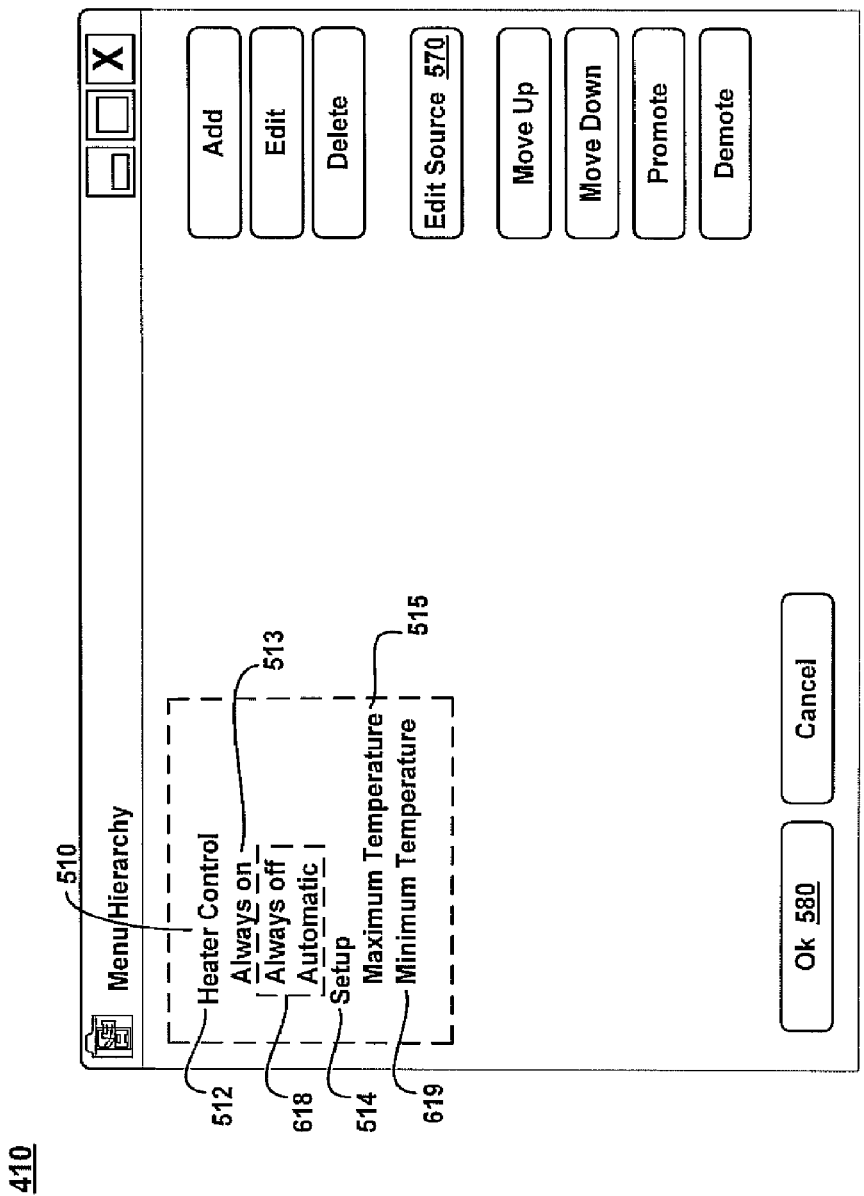
FIG. 6 shows an exemplary graphical user interface after configuration of a configurable menu hierarchy in accordance with one embodiment of the present invention.

FIG. 6 shows exemplary GUI 410 after configuration of configurable menu hierarchy 510 in accordance with one embodiment of the present invention. As shown in FIG. 6, the names of the one or more nodes of hierarchy 510 have been changed. For example, node 512 is now named "Heater Control." Additionally, the structure of configurable menu hierarchy 510 has also changed. For example, nodes 516-517 of FIG. 5A have been removed, while nodes 618-619 have been added.

It should be appreciated that other changes to hierarchy 510 as depicted in FIG. 5A may be made to produce the resulting hierarchy depicted in FIG. 6. For example, node 516 of FIG. 5A may be demoted to an item node and moved up to form one of nodes 618. Additionally, node 517 may be moved up to form the other one of nodes 618. And in other embodiments, other configuration changes may be made to generate hierarchy 510 depicted in FIG. 6.

Hierarchy 510 as depicted in FIG. 6 may be used to generate firmware (e.g., 425) for programming programmable integrated circuit 120 for use in an environmental control system or thermostat in one embodiment. As such, menu hierarchy 510 may relate to a menu implemented using programmable integrated circuit 120 (e.g., presented on a display of the thermostat). In this manner, each node of hierarchy 510 may relate to a node of the menu accessed by interacting with the thermostat (e.g., by pressing buttons of the thermostat to alter the display of the menu on the thermostat display, etc.). As such, interaction with an item node of the menu presented by the thermostat may execute a function (e.g., turning on the heater, turning on the air conditioner, etc.) associated with that item node, where the function may correspond to a function associated with an item node of hierarchy 510 during configuration of hierarchy 510 using GUI 410 (e.g., using graphical object 570 to associate the function with the item node).

Figure 7:
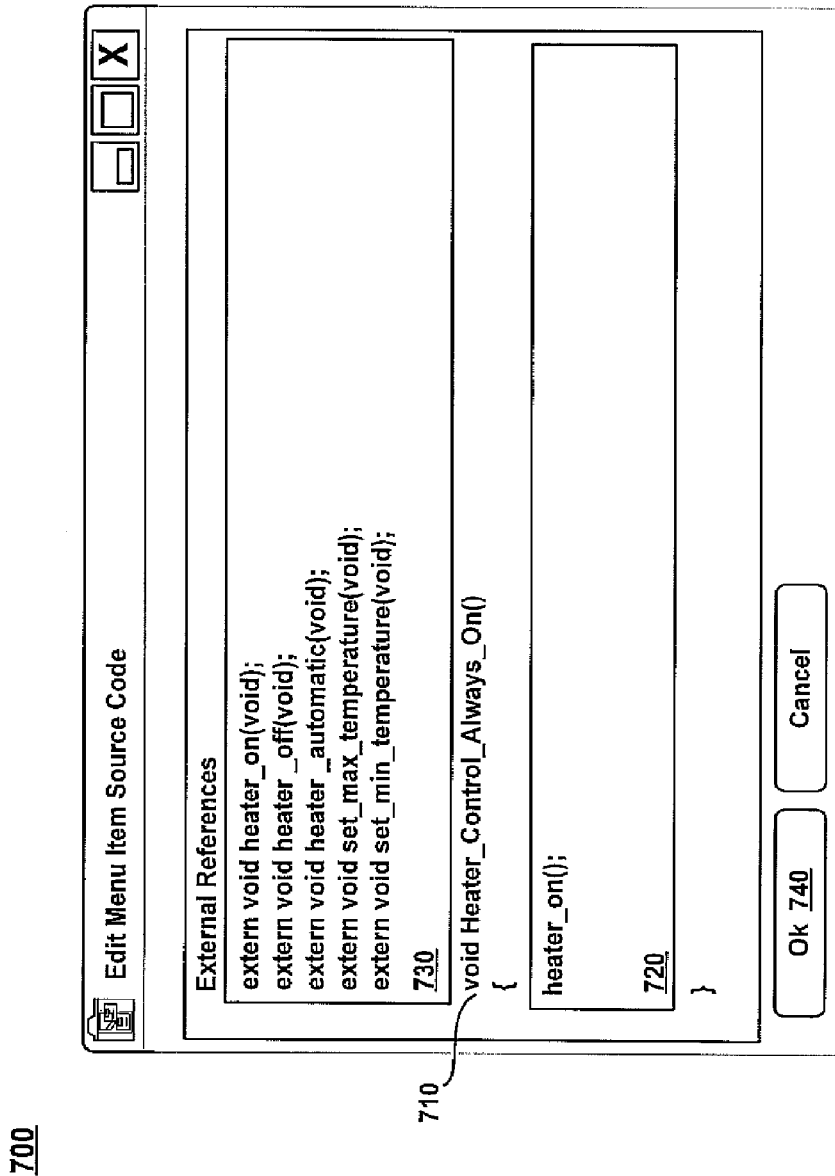
FIG. 7 shows an exemplary graphical user interface for supplying or identifying a function for association with a node of a configurable menu hierarchy in accordance with one embodiment of the present invention.

FIG. 7 shows exemplary GUI 700 for supplying or identifying a function for association with a node of configurable menu hierarchy 510 in accordance with one embodiment of the present invention. As shown in FIG. 7, header 710 may indicate a function name (e.g., "Always On") and/or node from hierarchy 510 (e.g., node 513 named "Always On") which may be associated with the function supplied and/or entered using GUI 700. Region 720 may be used to enter and/or identify code, subroutines, parameters or the like for the function (e.g., to be associated with a node of hierarchy 510). In one embodiment, text may be manually entered into region 720. Region 730 may be used to supply and/or enter additional code associated with or otherwise referenced by code entered in region 720. For example, the additional code entered in region 730 may include a location or path of a subroutine (e.g., entered in region 720), parameters (e.g., of a function or subroutine entered in region 720), a return type (e.g., variable, etc. of a subroutine entered in region 720), a constant or variable (e.g., used by a subroutine entered in region 720), etc.

Alternatively, code or external references selected from region 730 may cause the function specified in region 720 to be modified (e.g., by inserting the external reference in the function, by copying code associated with the external reference into region 720, etc.). Once the function is defined, supplied, identified, etc., then interaction with graphical object 740 may save the information entered for the function, associate the function with the selected node (e.g., 513), close GUI 700, return control to GUI 410, or some combination thereof, in one embodiment.

Turning back to FIG. 6, interaction with graphical object 580 may generate menu hierarchy data structure 415 for the configured menu hierarchy 515 as depicted in FIG. 6. Device configuration data (e.g., 422) may then be accessed (e.g., from GUI 300) for generating firmware 425 for implementing a menu (e.g., corresponding to menu hierarchy 510) using programmable integrated circuit 120 (e.g., incorporated with the thermostat). For example, where the thermostat has three buttons (e.g., mechanical buttons, soft buttons displayed on a display screen, etc.), GUI 300 may be used to associate each button with a different item node of hierarchy 310 (e.g., by dragging icons associated with the buttons into region 310 of GUI 300, associating the icons with a respective item node, etc.). In one embodiment, when the "heater control" menu of node 512 is presented on the thermostat, a first button may be associated with (and thereafter used to select) the "always on" function (e.g., of node 513), a second button may be associated with (and thereafter used to select) the "always off" function (e.g., of the top node of nodes 618), and a third button may be associated with (and thereafter used to select) the "automatic" function (e.g., of the bottom node of nodes 618). As such, device configuration data 422 may include the associations between the buttons of the thermostat and nodes of hierarchy 510.

Although FIGS. 6 and 7 correspond to an environmental control system or thermostat application, it should be appreciated that embodiments of the present invention may also be applied to other applications. For example, embodiments may be used to implement menus in alarm systems, printers, portable electronic devices, etc.

Figure 8:
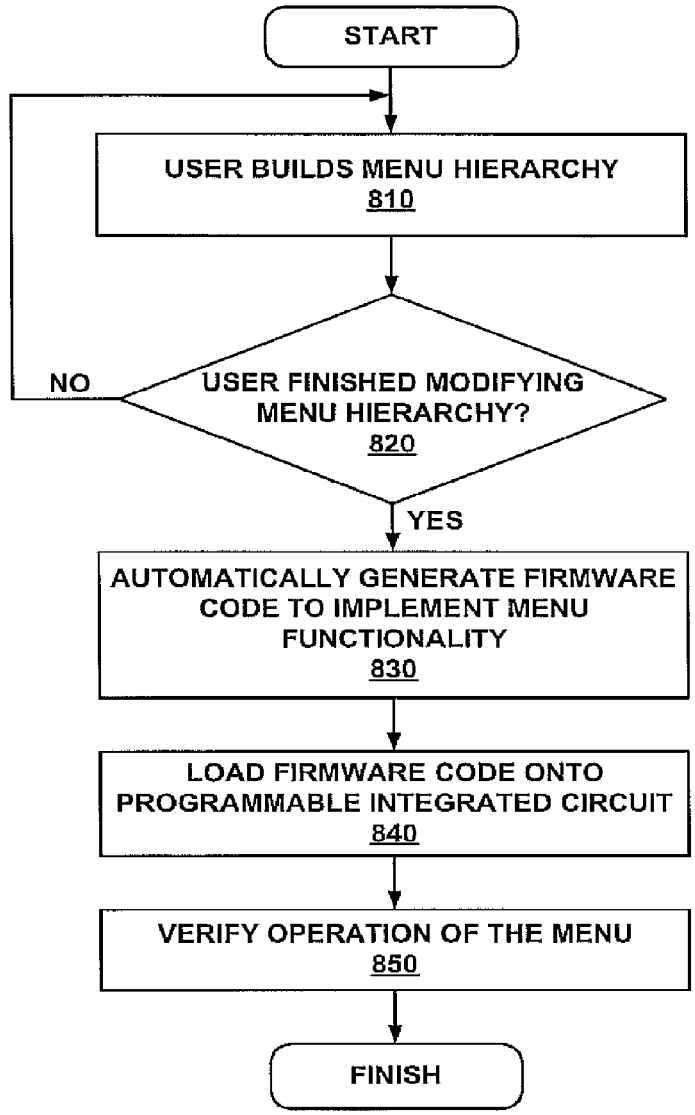
FIG. 8 shows a flow diagram of an exemplary computer-implemented process for generating firmware code for a programmable integrated circuit and verifying operation of menu functionality implemented using the firmware code in accordance with one embodiment of the present invention.

FIG. 8 shows a flow diagram of exemplary computer-implemented process 800 for generating firmware code for a programmable integrated circuit and verifying operation of menu functionality implemented using the firmware code in accordance with one embodiment of the present invention. As shown in FIG. 8, step 810 involves a user building a menu hierarchy. In one embodiment, the menu hierarchy (e.g., 510) presented using a GUI (e.g., 410). A user may interact with the GUI (e.g., 410) to build and/or configure the menu hierarchy.

Step 820 involves determining whether a user has finished modifying the menu hierarchy. In one embodiment, it may be determined that a user is finished modifying the menu hierarchy (e.g., 510) if a graphical object (e.g., 580) of the GUI (e.g., 410) has been interacted with (e.g., by the user building the hierarchy in step 810). If it is determined that a user has not finished building and/or modifying the hierarchy (e.g., 510), then step 810 may be repeated. Alternatively, if it is determined that a user has finished building and/or modifying the hierarchy (e.g., 510), then step 830 may be performed.

As shown in FIG. 8, Step 830 involves automatically generating firmware code (e.g., 425) to implement menu functionality. The firmware code (e.g., 425) may be based upon device configuration data (e.g., 422) which relates the menu hierarchy (e.g., defined by data structure 415) to components of the programmable integrated circuit (e.g., 120) and/or an electronic device (e.g., 450) including or incorporating the programmable integrated circuit (e.g., 120). Additionally, the firmware code may be generated in response to an interaction (e.g., a user interaction) with a GUI for creating the menu hierarchy (e.g., 410), a GUI (e.g., 300) for implementing a programming component or design tool (e.g., 140), etc.

Step 840 involves loading the firmware code (e.g., 425) onto a programmable integrated circuit (e.g., 120). The firmware code (e.g., 425) may be loaded onto the programmable integrated circuit (e.g., 120) via a communication or programming interface (e.g., 130) in one embodiment.

As shown in FIG. 8, step 850 involves verifying the operation of the menu (e.g., related to configurable menu hierarchy

510). The menu functionality may be implemented on an electronic device (e.g., 450) comprising the programmable integrated circuit (e.g., 120) in one embodiment. Additionally, it should be appreciated that verification of the menu operation in step 850 may comprise interacting with a user interface (e.g., 455) of the electronic device (e.g., 450), simulating and/or emulating the menu functionality (e.g., using system 100 of FIG. 1) implemented by the programmable integrated circuit (e.g., 120), or the like.

Figure 9:
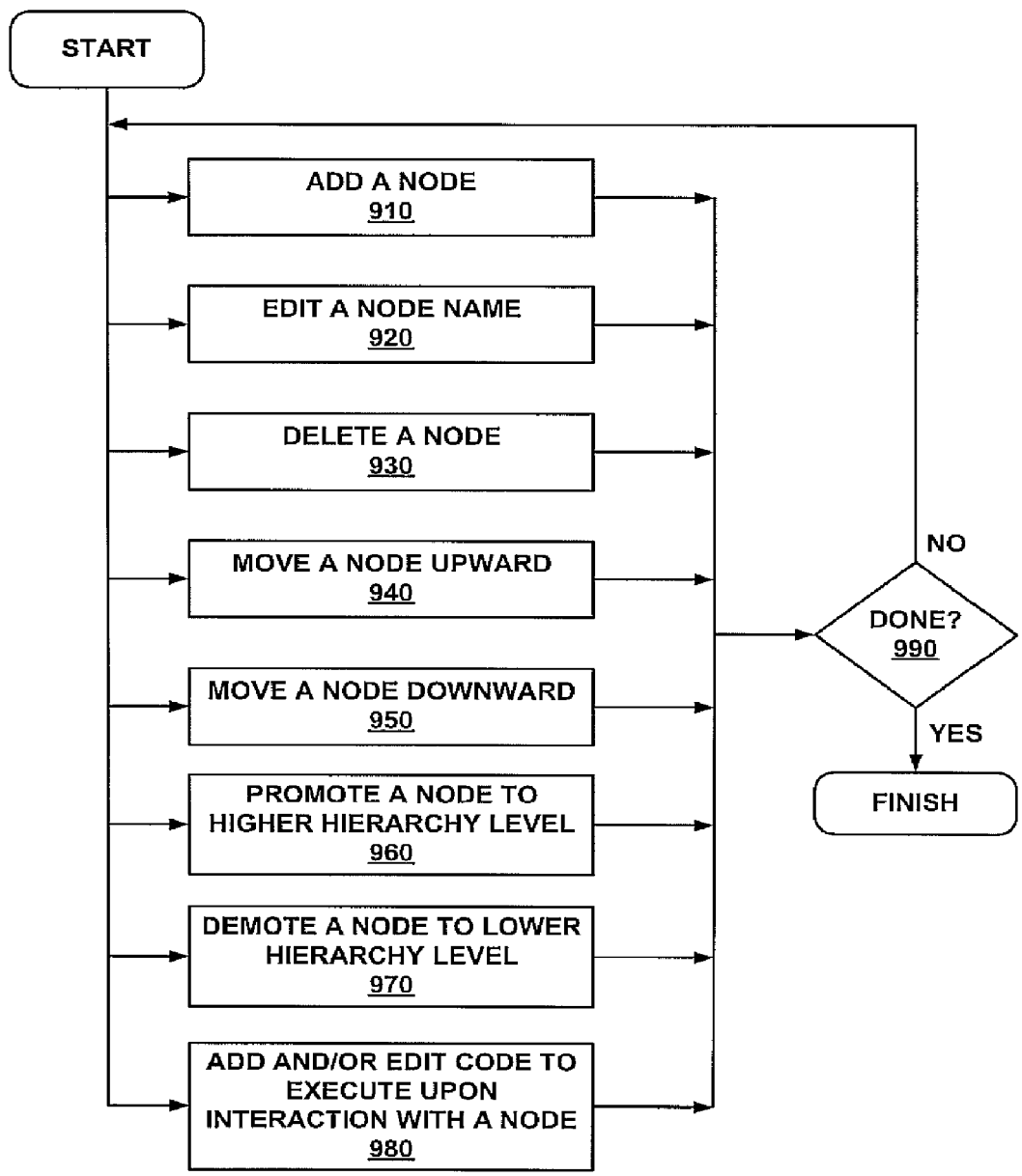
FIG. 9 shows a flowchart of an exemplary process for building a menu hierarchy in accordance with one embodiment of the present invention.

FIG. 9 shows a flowchart of exemplary process 900 for building a menu hierarchy (e.g., 510) in accordance with one embodiment of the present invention. In one embodiment, one or more steps of process 900 may be used to implement step 810 and/or step 820 of FIG. 8. Additionally, it should be appreciated that one or more of steps 910-980 of process 900 may be performed simultaneously and/or in parallel in one embodiment.

As shown in FIG. 9, step 910 involves adding a node. A node (e.g., 512, 513, etc.) may be added to a configurable menu hierarchy (e.g., 510) using a graphical object (e.g., 520) for adding nodes in one embodiment.

Step 920 involves editing the name of a node. The name of a node (e.g., 512, 513, etc.) may be edited using a graphical object (e.g., 540) for editing the name of a node in one embodiment.

As shown in FIG. 9, step 930 involves removing a node. A node (e.g., 512, 513, etc.) may be removed from a configurable menu hierarchy (e.g., 510) using a graphical object (e.g., 530) for removing a node in one embodiment.

Step 940 involves moving a node upward. A node (e.g., 512, 513, etc.) may be moved upward in a configurable menu hierarchy (e.g., 510) using a graphical object (e.g., 550) for moving a node upward in one embodiment.

As shown in FIG. 9, step 950 involves moving a node downward. A node (e.g., 512, 513, etc.) may moved downward in a configurable menu hierarchy (e.g., 510) using a graphical object (e.g., 555) for moving a node downward in one embodiment.

Step 960 involves promoting a node to a higher hierarchy level. A node (e.g., 512, 513, etc.) may be promoted to a higher hierarchy level of a configurable menu hierarchy (e.g., 510) using a graphical object (e.g., 560) for promoting a node to a higher hierarchy level in one embodiment.

As shown in FIG. 9, step 970 involves demoting a node to a lower hierarchy level. A node (e.g., 512, 513, etc.) may be demoted to a lower hierarchy level of a configurable menu hierarchy (e.g., 510) using a graphical object (e.g., 565) for demoting a node to a lower hierarchy level in one embodiment.

Step 980 involves adding and/or editing code to execute upon interaction with a node. The code may be added using a GUI (e.g., 700) for adding and/or editing code to be associated with a node of the configurable menu hierarchy (e.g., 510). The GUI for adding and/or editing the code (e.g., 700) may be initiated in response to interaction with a graphical object (e.g., 570) of the GUI (e.g., 410) for configuring the menu hierarchy (e.g., 510). Additionally, the code may be executed in response to an interaction with a user interface (e.g., 455) of an electronic device (e.g., 450) which implements menu functionality associated with the configurable menu hierarchy (e.g., 510).

As shown in FIG. 9, step 990 involves determining whether user modification of the configurable menu hierarchy (e.g., 510) is complete. In one embodiment, step 990 may be performed analogously to step 820 of FIG. 8. If it is determined that the user is not finished interacting with the menu hierarchy (e.g., 510), then one or more of steps 910-980 may be performed again. Alternatively, If it is determined that the user is finished interacting with the menu hierarchy (e.g., 510), then process 900 may terminate.

Figure 10:
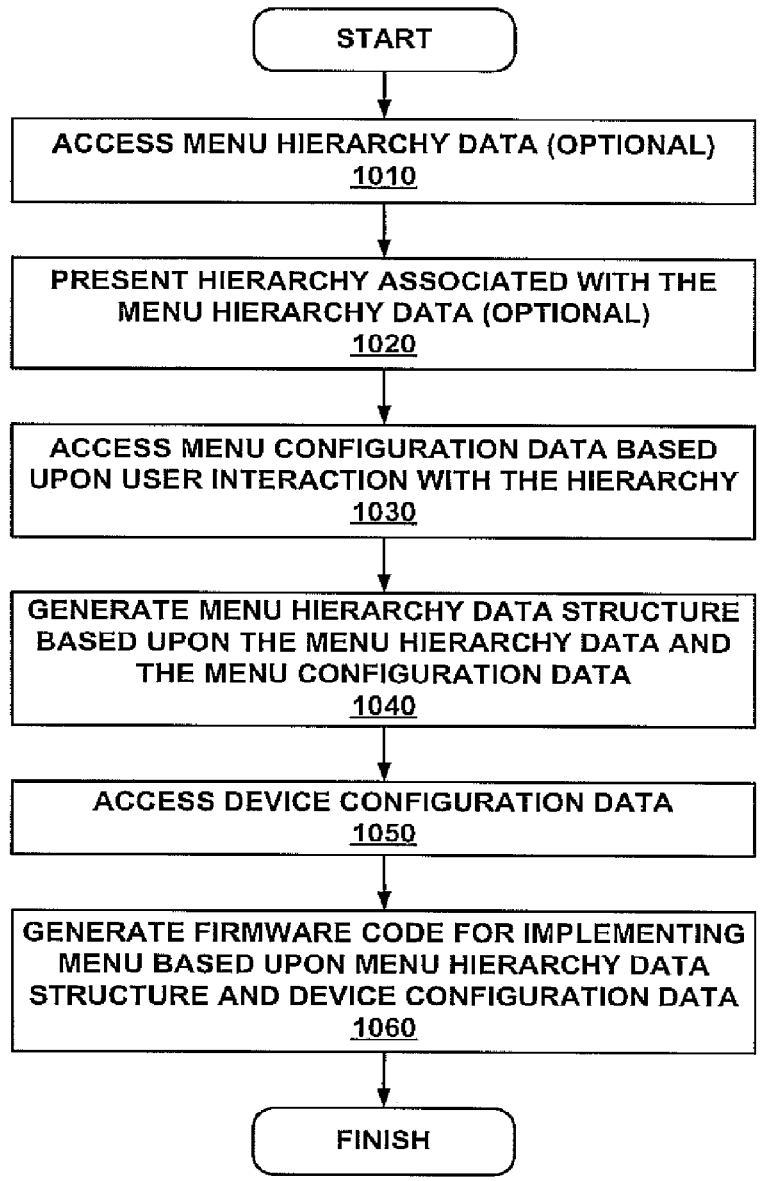
FIG. 10 shows a flow diagram of an exemplary computer-implemented process for generating firmware code for a programmable integrated circuit

FIG. 10 shows a flow diagram of exemplary computer-implemented process 1000 for generating firmware code for a programmable integrated circuit in accordance with one embodiment of the present invention. In one embodiment, one or more steps of process 1000 may be used to implement at least one step of process 800 of FIG. 8.

As shown in FIG. 10, step 1010 involves accessing menu hierarchy data (e.g., 412). The menu hierarchy data (e.g., 412) may comprise a template with at least one placeholder (e.g., for menu hierarchy configuration data, executable code, etc.).

Step 1020 involves presenting a hierarchy associated with the menu hierarchy data (e.g., 412). The hierarchy may be presented using a graphical user interface (e.g., 410) for configuring the hierarchy, and therefore, the hierarchy may comprise a configurable menu hierarchy (e.g., 510). The hierarchy may include a plurality of nodes, where the plurality of nodes include a node associated with a sub-menu (e.g., 512, 514, 516, etc.) and at least one node associated with execution of a function (e.g., 513, 515, 517, etc.). Additionally, the nodes of the hierarchy (e.g., 510) may be arranged into parent nodes (e.g., 512, 514, 516, etc.) and child nodes (e.g., 513, 515, 517, etc.), where at least one of the child nodes (e.g., 513) is a child node of a parent node (e.g., 512).

Step 1030 involves accessing menu hierarchy configuration data (e.g., 414) based upon user interaction with the hierarchy (e.g., 510). The configuration data (e.g., 414) may include data for reorganizing the hierarchy (e.g., addition of nodes, removal of nodes, promotion of nodes, demotion of nodes, reorganizing nodes, renaming of nodes, etc.), where the configuration data (e.g., 414) may be based on changes to the configurable hierarchy using the GUI (e.g., 410). In another embodiment, the configuration data (e.g., 414) may include one or more functions and/or executable code (e.g., supplied using graphical object 580 or another feature of GUI 410) associated with one or more nodes of the hierarchy (e.g., 510).

In one embodiment, steps 1010 and/or 1020 may be omitted. For example, the GUI (e.g., 410) for presenting the menu hierarchy (e.g. 510) may be created from scratch by a user using a GUI (e.g., 410) in step 1030. In this manner, the menu hierarchy data (e.g., 412) may contain little or no information about the displayed menu hierarchy (e.g., 510). In other embodiments, the menu hierarchy data (e.g., 412) may not be accessed, thereby creating the displayed menu hierarchy (e.g., 510) without a template.

As shown in FIG. 10, step 1040 involves generating a menu hierarchy data structure based upon the menu hierarchy data (e.g., 412) and the menu hierarchy configuration data (e.g., 414). The menu hierarchy data structure (e.g., 415) may comprise organizational data for the hierarchy (e.g., based upon configuration of hierarchy 510 using GUI 410) and/or executable code (e.g., entered into GUI 700 in response to interaction with graphical object 570) associated with nodes of the hierarchy (e.g., 510) in one embodiment. The executable code may be for execution (e.g., by a device or system incorporating or otherwise utilizing programmable integrated circuit 120 which accesses the data structure or firmware generated based thereon) in response to a selection (e.g., by pressing a button of the device or system) of an item node of a menu (e.g., implemented on the device or system using programmable integrated circuit 120) associated with the item node (e.g., 513, 515, 517, etc.) of the configurable menu hierarchy (e.g., 510). Additionally, where the menu hierarchy data (e.g., 412) comprises a template with at least one place holder, the configuration data (e.g., 414) may be inserted or otherwise applied to the template (e.g., data 412) in step 1040 to generate the data structure (e.g., 415).

Step 1050 involves accessing device configuration data. The device configuration data (e.g., 422) may be captured or collected based upon user inputs and/or data accessed by a graphical user interface (e.g., 300). The device configuration data (e.g., 422) may be used to program a programmable integrated circuit (e.g., 120) in one embodiment. Additionally, the device configuration data may include information about a configuration of at least one component of the programmable integrated circuit (e.g., 120), where the configuration may be for implementing the menu external to the programmable integrated circuit (e.g., within a device or system using or incorporating programmable integrated circuit 120) using the at least one component of the programmable integrated circuit. The component of the programmable integrated circuit (e.g., 120) for implementing the menu may include at least one pin (e.g., I/O pins 230 of FIG. 2A), at least one memory (e.g., SRAM 260 of FIG. 2A, flash ROM 270 of FIG. 2A, etc.), at least one processor (e.g., CPU or microprocessor 220 of FIG. 2A), at least one analog block (e.g., analog blocks 242 of FIG. 2B), at least one digital block (e.g., digital blocks 244 of FIG. 2B), at least one bus (e.g., system bus 210 of FIG. 2A), some combination thereof, etc.

As shown in FIG. 10, step 1060 involves generating firmware code for implementing the menu based upon the menu hierarchy data structure (e.g., 415) and the device configuration data (e.g., 422). The firmware code may be stored within the programmable integrated circuit (e.g., 120) and enable implementation of the menu external to the programmable integrated circuit (e.g., on a device or system utilizing or incorporating the programmable integrated circuit). Additionally, the firmware code (e.g., 425) may be included in or otherwise enable implementation of an embedded application for execution for the programmable integrated circuit (e.g., 120).

Figure 11:
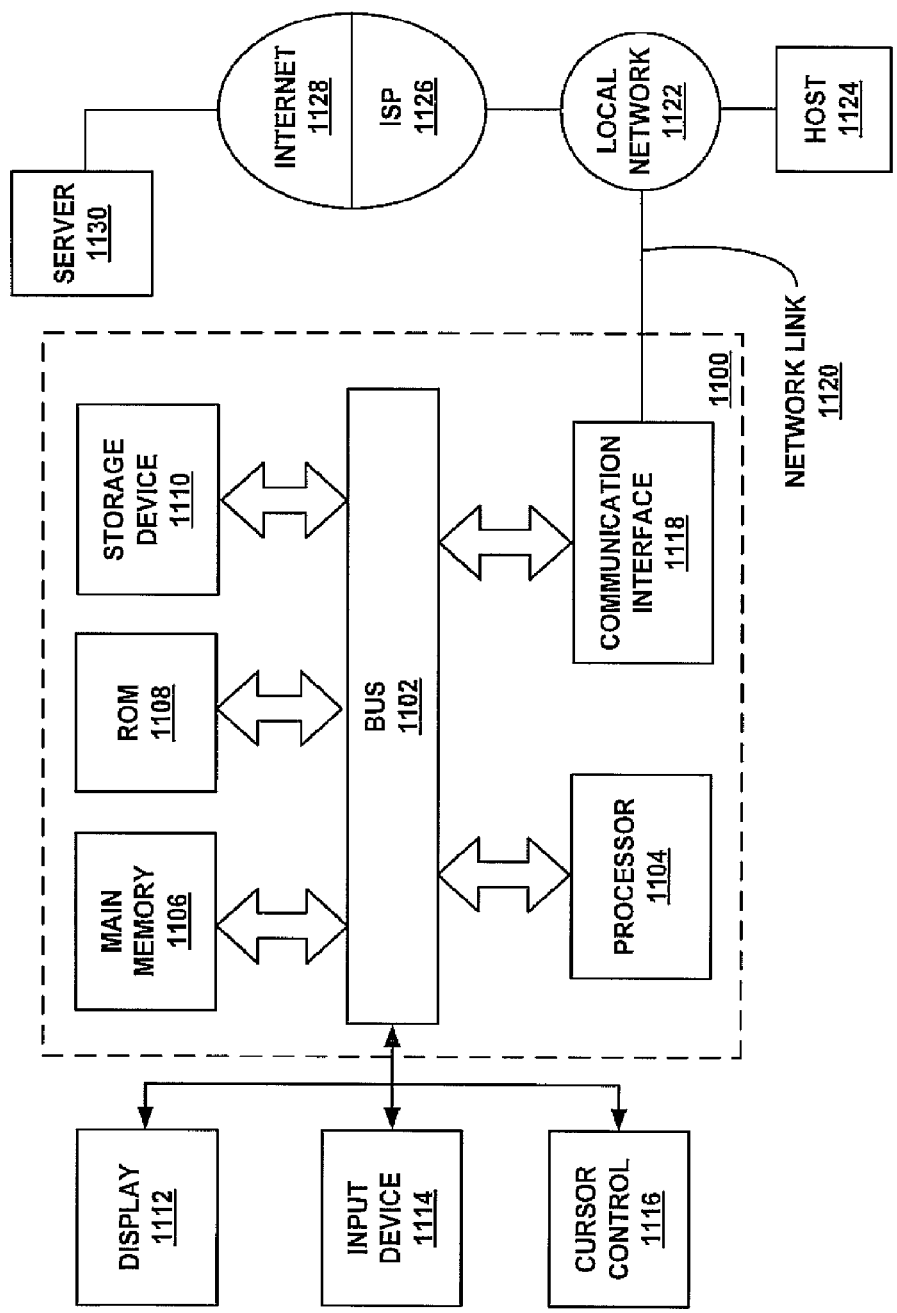
FIG. 11 shows an exemplary computer system upon which embodiments of the present invention may be implemented.

FIG. 11 shows exemplary computer system 1100 upon which embodiments of the present invention may be implemented. With reference to FIG. 11, portions of the present invention are comprised of computer-readable and computer-executable instructions that reside, for example, in computer system 1100 which may be used as a part of a general purpose computer network (not shown). It is appreciated that computer system 1100 of FIG. 11 is merely exemplary. As such, the present invention can operate within a number of different computer systems including general-purpose computer systems, embedded computer systems, laptop computer systems, hand-held computer systems, and stand-alone computer systems.

In the present embodiment, computer system 1100 includes an address/data bus 1102 for conveying digital information between the various components, a central processor unit (CPU) 1104 coupled to bus 1102 for processing the digital information and instructions, a volatile main memory 1106 coupled to bus 1102 comprised of volatile random access memory (RAM) for storing the digital information and instructions, and a non-volatile read only memory (ROM) 1108 coupled to bus 1102 for storing information and instructions of a more permanent nature. In addition, computer system 1100 may also include a data storage device 1110 (e.g., a magnetic, optical, floppy, tape drive, etc.) coupled to bus 1102 for storing larger amounts of data. Data (e.g., comprising instructions, commands, etc.) for performing a process (e.g., 1100, 1000, 1100, etc.) for generating a data structure (e.g., 415) and/or firmware code (e.g., 425) for a programmable integrated circuit may be stored in main memory 1106, ROM 1108, storage device 1110, registers within processor 1104 (not shown), in an external storage device (not shown), or some combination thereof.

As shown in FIG. 11, computer system 1100 may be coupled via bus 1102 to an optional display device 1112 (e.g., a CRT monitor, LCD monitor, etc.) for displaying information received from computer system 1100. An optional input device 1114 (e.g., an alphanumeric keyboard) may also be coupled to computer system 1100 via bus 1102 for communicating information and command selections to processor 1104. Cursor control device 1116 (e.g., a mouse, trackball, light pen, etc.) may also be coupled to computer system 1100 via bus 1102 for communicating direction information and command selections to processor 1104 and for controlling cursor movement (e.g., on display 1112). Additionally, computer system 1100 can include a mechanism for emitting an audible signal (not shown).

Computer system 1100 may also include a communication interface 1118 coupled to bus 1102. Communication interface 1118 provides a two-way data communication coupling to local network 1122 via network link 1120. For example, communication interface 1118 may be an integrated services digital network (ISDN) device or a modem to provide a data communication connection to a corresponding type of telephone line. As another example, communication interface 1118 may be a local area network (LAN) device to provide a data communication connection to a compatible LAN. And as yet another example, network link 1120 may comprise a wireless connection between communication interface 1118 and local network 1122. Regardless of the implementation utilized, communication interface 1118 may send and receive electrical, electromagnetic, and/or optical signals that carry digital data streams representing various types of information.

As shown in FIG. 11, network link 1120 may provide data communication through one or more networks to other data devices. For example, network link 1120 may provide a connection through local network 1122 to a host computer 1124 or to data equipment operated by internet service provider (ISP) 1126. ISP 1126 in turn provides data communication services through the worldwide packet data communication network, now commonly referred to as the "internet" 1128. Local network 1122 and internet 1128 may use electrical, electromagnetic, and/or optical signals to convey digital data streams. The signals through the various networks and network link 1120, which carry digital data to and from computer system 1100, are exemplary forms of carrier waves transporting information.

Accordingly, computer system 1100 can send and receive messages through network(s), network link 1120, and communication interface 1118. For example, server 1130 might transmit a requested code for an application program through internet 1128, ISP 1126, local network 1122, and communication interface 1118. The received code may be executed by processor 1104 upon receipt, and/or be stored in one of the coupled memory devices (e.g., storage device 1110, ROM 1108, RAM 1106, etc.) for later execution.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A computer-implemented method of generating instructions and data, said method comprising:
   accessing menu hierarchy data for a menu hierarchy;
   accessing menu hierarchy configuration data associated with a configuration of said menu hierarchy, wherein said menu hierarchy configuration data comprises a change to the configuration of said menu hierarchy;
   generating a data structure based upon said menu hierarchy data and said menu hierarchy configuration data; and
   automatically generating said instructions and data based upon said data structure, said instructions and data for storage within a programmable integrated circuit and further for implementing menu functionality in combination with at least one user interface device of an electronic device utilizing said programmable integrated circuit, said menu functionality based upon said menu hierarchy configuration data.

2. The method of claim 1, wherein said data structure comprises information about a node of said menu hierarchy, and wherein said information is selected from a group consisting of title for said node, a pointer to a child node of said node, a pointer to a parent node of said node, a pointer to a child menu of said node, a number of child nodes of said node, and a pointer to a function for execution upon selection of said node.

3. The method of claim 1, wherein said menu functionality is selected from a group consisting of presentation of a sub-menu using said user interface device and execution of a function associated with said electronic device.

4. The method of claim 1, wherein said user interface device of said electronic device is selected from a group consisting of a display device, a mechanically-actuated button, a button displayed on said display device, an input button, and a label displayed on said display device.

5. The method of claim 1, wherein said menu hierarchy comprises a configurable menu hierarchy presented using a graphical user interface, said configurable menu hierarchy comprising a plurality of expandable and collapsible nodes, and wherein said menu hierarchy configuration data is based upon a user configuration of said menu hierarchy using said graphical user interface.

6. The method of claim 1, wherein said menu hierarchy comprises at least one parent node associated with presentation of a sub-menu, wherein said sub-menu comprises at least one child node of said parent node, and wherein said child node is associated with execution of a function.

7. The method of claim 1, wherein said menu hierarchy data comprises placeholders for data related to nodes of said menu hierarchy, and wherein said generating said data structure further comprises inserting portions of said menu hierarchy configuration data into said placeholders of said menu hierarchy data.

8. A computer system comprising a processor coupled to a bus and a memory coupled to said bus, wherein said memory comprises instructions that when executed on said processor implement a method of generating instructions and data, said method comprising:
   accessing menu hierarchy data for a menu hierarchy;
   accessing menu hierarchy configuration data associated with a configuration of said menu hierarchy, wherein said menu hierarchy configuration data comprises a change to the configuration of said menu hierarchy;
   generating a data structure based upon said menu hierarchy data and said menu hierarchy configuration data; and
   automatically generating said instructions and data based upon said data structure, said instructions and data for storage within a programmable integrated circuit and further for implementing menu functionality in combination with at least one user interface device of an electronic device utilizing said programmable integrated circuit, said menu functionality based upon said menu hierarchy configuration data.

9. The computer system of claim 8, wherein said data structure comprises information about a node of said menu hierarchy, and wherein said information is selected from a group consisting of title for said node, a pointer to a child node of said node, a pointer to a parent node of said node, a pointer to a child menu of said node, a number of child nodes of said node, and a pointer to a function for execution upon selection of said node.

10. The computer system of claim 8, wherein said menu functionality is selected from a group consisting of presentation of a sub-menu using said user interface device and execution of a function associated with said electronic device.

11. The computer system of claim 8, wherein said user interface device of said electronic device is selected from a group consisting of a display device, a mechanically-actuated button, a button displayed on said display device, an input button, and a label displayed on said display device.

12. The computer system of claim 8, wherein said menu hierarchy comprises a configurable menu hierarchy presented using a graphical user interface, said configurable menu hierarchy comprising a plurality of expandable and collapsible nodes, and wherein said menu hierarchy configuration data is based upon a user configuration of said menu hierarchy using said graphical user interface.

13. The computer system of claim 8, wherein said menu hierarchy comprises at least one parent node associated with presentation of a sub-menu, wherein said sub-menu comprises at least one child node of said parent node, and wherein said child node is associated with execution of a function.

14. The computer system of claim 8, wherein said menu hierarchy data comprises placeholders for data related to nodes of said menu hierarchy, and wherein said generating said data structure further comprises inserting portions of said menu hierarchy configuration data into said placeholders of said menu hierarchy data.

15. A graphical user interface provided on an electronic device, the graphical user interface comprising:
   a configurable menu hierarchy comprising a plurality of nodes organized into at least one hierarchy level, wherein said configurable menu hierarchy is based upon menu hierarchy data and menu hierarchy configuration data;
   a first graphical object, generated by a processor of the electronic device, for initiating generation of a data structure based upon said menu hierarchy data and menu hierarchy configuration data, wherein said menu hierarchy configuration data is related to a configuration of said configurable menu hierarchy and comprises a change to the configuration of said configurable menu hierarchy, wherein said data structure is for generating firmware code for storage within said programmable integrated circuit, wherein said firmware code is further for implementing menu functionality in combination with a user interface device and in accordance with said menu hierarchy configuration data.

16. The graphical user interface of claim 15, wherein said plurality of nodes are organized into at least two hierarchy levels, wherein said plurality of nodes comprises a parent node and at least one child node, and wherein said at least one child node comprises a child node of said parent node.

17. The graphical user interface of claim 15 further comprising:
   a second graphical object for modifying a configuration of said configurable menu hierarchy.

18. The graphical user interface of claim 17, wherein said modifying said configuration of said configurable menu hierarchy is selected from a group consisting of adding a node to said configurable menu hierarchy, removing a node from said configurable menu hierarchy, editing a name of a node, reordering said plurality of nodes, promoting a node to higher hierarchy level, and demoting a node to lower hierarchy level.

19. The graphical user interface of claim 17, wherein said modifying said configuration of said configurable menu hierarchy comprises supplying executable code for association with a node of said configurable menu hierarchy, wherein said data structure comprises said executable code, and wherein said executable code is for execution in response to a selection of menu functionality associated with said child node of said configurable menu hierarchy.

20. The graphical user interface of claim 15, wherein said firmware code is further based upon device configuration data associated with said programmable integrated circuit, wherein said device configuration data comprises information about a configuration of at least one component of said programmable integrated circuit, and wherein said configuration is for implementing said menu functionality external to said programmable integrated circuit using said at least one component of said programmable integrated circuit.

21. The graphical user interface of claim 20, wherein said at least one component of said programmable integrated circuit is selected from a group consisting of at least one pin, at least one memory, at least one processor, at least one analog block, at least one digital block, and at least one bus.

* * * * *